(12) United States Patent
Tsuruta et al.

(10) Patent No.: US 7,042,697 B2
(45) Date of Patent: May 9, 2006

(54) ELECTROSTATIC CHUCKS AND ELECTROSTATICALLY ATTRACTING STRUCTURES

(75) Inventors: Hideyoshi Tsuruta, Tokai (JP); Naohito Yamada, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 366 days.

(21) Appl. No.: 10/675,524

(22) Filed: Sep. 30, 2003

(65) Prior Publication Data

US 2004/0070916 A1    Apr. 15, 2004

Related U.S. Application Data

(63) Continuation of application No. 09/859,738, filed on May 16, 2001, now abandoned.

(30) Foreign Application Priority Data

May 19, 2000    (JP) ............................. 2000-147170

(51) Int. Cl.
*H02N 13/00* (2006.01)
(52) U.S. Cl. ...................................... 361/234; 361/233
(58) Field of Classification Search ................ 361/231, 361/233, 234
See application file for complete search history.

(56) References Cited

U.S. PATENT DOCUMENTS

| 5,151,845 | A | 9/1992 | Watanabe et al. |
|---|---|---|---|
| 5,384,681 | A | 1/1995 | Kitabayashi et al. |
| 5,426,558 | A | 6/1995 | Sherman |
| 5,607,541 | A | 3/1997 | Kubota et al. |
| 5,745,331 | A | 4/1998 | Shamouilian et al. |
| 5,800,618 | A | 9/1998 | Niori et al. |
| 5,851,298 | A | 12/1998 | Ishii |
| 5,880,924 | A * | 3/1999 | Kumar et al. ................ 361/234 |
| 5,886,863 | A | 3/1999 | Nagasaki et al. |
| 5,946,183 | A | 8/1999 | Yamada et al. |
| 6,071,630 | A | 6/2000 | Tomaru |
| 6,125,025 | A | 9/2000 | Howald et al. |
| 6,134,096 | A | 10/2000 | Yamada et al. |
| 6,256,187 | B1 | 7/2001 | Matsunaga et al. |

FOREIGN PATENT DOCUMENTS

| EP | 0791956 A2 | 8/1997 |
|---|---|---|
| JP | 02-160444 | 6/1990 |
| JP | 06-244119 | 9/1994 |
| JP | 06-244144 | 9/1994 |
| JP | 9-260473 | 10/1997 |
| JP | 10-150098 A | 6/1998 |
| JP | 11-111828 | 4/1999 |
| JP | 2000-332091 | 11/2000 |
| KR | 2000-0017045 | 7/2000 |
| TW | 287314 | 10/1996 |
| TW | 392277 | 6/2000 |
| WO | 99/54928 | 10/1999 |
| WO | 00/19519 A | 4/2000 |
| WO | 00/72376 A1 | 11/2000 |

* cited by examiner

*Primary Examiner*—Brian Sircus
*Assistant Examiner*—Zeev Kitov
(74) *Attorney, Agent, or Firm*—Burr & Brown

(57) ABSTRACT

An electrostatic chuck includes a substrate having a wafer-installing face and an opposed back face. An electrostatic chucking electrode is buried in the substrate, and an insulating layer is provided on the back face of the substrate. The substrate also includes a dielectric layer including at least the wafer-installing face and surrounding the electrostatic chucking electrode, and the insulating layer includes an insulating material having a larger volume resistivity than that of the dielectric layer.

18 Claims, 2 Drawing Sheets

PRIOR ART

ELECTROSTATIC CHUCKS AND ELECTROSTATICALLY ATTRACTING STRUCTURES

CROSS REFERENCE TO RELATED APPLICATION

This application is a continuation of U.S. application Ser. No. 09/859,738, filed May 16, 2001, now abandoned the entirety of which is incorporated herein by reference.

BACKGROUND OF THE INVENTION

1. Field of the Invention

The present invention relates to electrostatic chucks.

2. Related Art Statement

Electrostatic chucks are usually provided with a number of projections or embossed portions projecting from installing faces of their insulating layers and having top faces (contacting faces) to be contacted with semiconductor wafers. Applying DC voltage to an internal electrode inside the insulating layer produces a Johnsen-Rahbek force at the contact interface between the semiconductor wafer and the contact faces of the projections, which attracts the semiconductor wafer onto the contact faces.

At present, high-density plasma is formed above the semiconductor wafer in the case of high-density plasma (HDP) CVD and etching for the semiconductor wafers. In etching, the semiconductor wafer is attracted by means of the electrostatic chuck, and a cooling member is provided under the electrostatic chuck. A rise in the temperature of the semiconductor wafer is prevented by the escaping heat flowing from the high-density plasma to the semiconductor into a side of the electrostatic chuck. In the case of the HDP CVD, the temperature of the semiconductor wafer is controlled to a desired temperature by escaping the heat flowing from the high-density plasma to the semiconductor wafer into the side of the electrostatic chuck from the semiconductor wafer at a constant rate.

In an electrostatic chuck utilizing the Johnsen-Rahbek force, the substrate is made of a semiconductor, and electrons or positive holes are moved inside the substrate. For example, when the substrate is made of an aluminum nitride-based ceramic material, the ceramic material is an n-type semiconductor. The conducting mechanism in the n-type semiconductor relies mainly upon the movement of electrons, and almost no positive holes move.

The present inventors produced electrostatic chucks of the Johnsen-Rahbek type. During this production, it happened that after the electrostatic chucks were joined to the cooling members, the attracting forces for the wafers decreased. In particular, such a problem hardly occurred at voltages of around 100 V, whereas the attracting voltage did not reach the intended level in the case of high voltages not less than 500 V.

SUMMARY OF THE INVENTION

It is an object of the present invention to prevent a reduction in the attracting voltage which may occur after the electrostatic chuck is joined to an electrically conductive member.

The present invention relates to an electrostatic chuck comprising a substrate having a wafer-installing face and a back face on an opposite side of the wafer-installing face, an electrostatic chucking electrode buried in the substrate, and an insulating layer provided at the back face of the substrate. The substrate comprises a dielectric layer having at least the wafer-installing face and surrounding the electrostatic chucking electrode, and the insulating layer comprises an insulating material having a volume resistivity higher than that of the dielectric layer.

The substrate is preferably provided at its back face with an electrically conductive member, which is particularly preferably a cooling member, particularly a metallic cooling member. However, the conductive member is not limited to the cooling member.

The present inventors examined the reduction in the attracting voltage occurring after the electrostatic chuck is joined to the electrically conductive member, and consequently reached the following hypothesis.

BRIEF DESCRIPTION OF THE DRAWINGS

For a better understanding of the invention, reference is made to the attached drawings, wherein.

DETAILED DESCRIPTION OF THE INVENTION

Figure 2:
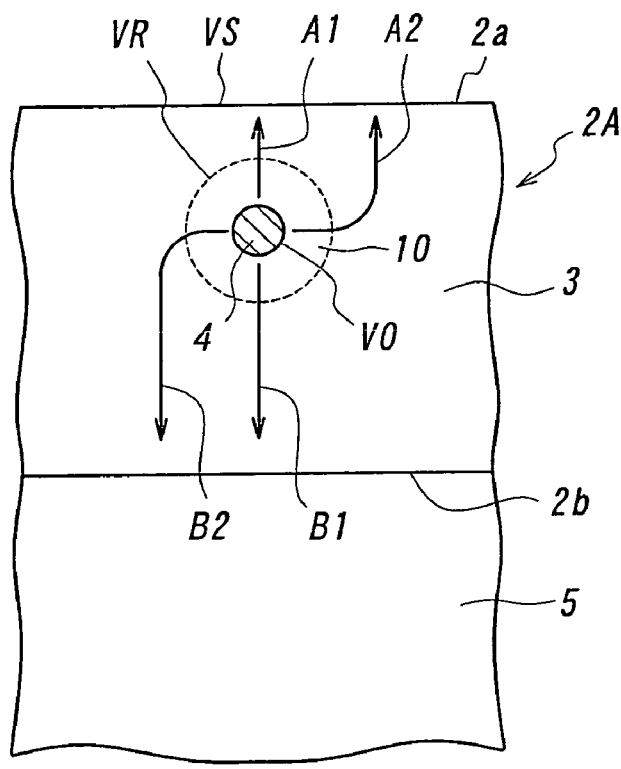
FIG. 2 is a schematic view illustrating an electrostatically attracting structure as the prior art.

As shown in FIG. 2, for example, if a cooling member 5 is joined to the back face 2b of the electrostatic chuck 2A, currents B1 and B2 flow toward the cooling member 5 from the electrostatic chucking electrode 4. A1 and A2 denote Johnsen-Rahbek currents flowing from the electrode 4 to the wafer-installing face 2a. However, it is thought from the common knowledge of those skilled in the art that such currents leak to the cooling member and do not influence the attracting voltage. For, when the electrode 4 is considered as a center, the current flows from the electrode 4 to the wafer-installing face 2a, and the current also flows from the electrode 4 to the back face 2b, such that the two current passages are of a parallel connection. Therefore, even assuming that the leakage currents B1, B2 to the back side 2b becomes very large, it is considered that the potential difference does not change between the electrode and the wafer-installing face at all, so that no influence occurs on the Johnsen-Rahbek current between the electrode and the wafer-installing face, and therefore the attracting voltage does not decrease.

However, the present inventors considered such common knowledge again, and reached the following hypothesis. That is, it was assumed that a given highly resistant area 10 exists around the electrode 4, and that the resistivity of this area 10 is higher than that of the surrounding dielectric layer 3. If this hypothesis is correct, it is considered that the increase in the leakage currents B1, B2 to the back face side decreases the attracting voltage.

For example, assume that VO, VR and VS are the potential of the electrode 4, a peripheral edge of the highly resistive area 10, and the installing face 2a, respectively. The potential difference (VO−VR) between the potential VR at the peripheral edge of the highly resistive area 10 and the potential VO of the electrode is a value obtained by multiplying the total of the Johnsen-Rahbek currents A1, A2 and the leakage currents B1, B2 by the resistance of the highly resistive area 10. Assuming that the volume resistivity of the highly resistive area 10 is sufficiently larger than that of the surrounding area, the potential difference (VO–VR) is larger than that (VR–VS). Also assuming that the leakage currents B1, B2 are sufficiently large, then the potential difference (VO–VR) depends upon the magnitude of the leakage currents B1, B2. As a result, as the leakage currents B1, B2 increase, the voltage drop between the electrode and the peripheral edge of the highly resistive area 10 increases, so that the Johnsen-Rahbek currents A1, A2 are decreased by the increased amount, resulting in the lowered attracting voltage.

Figure 1:
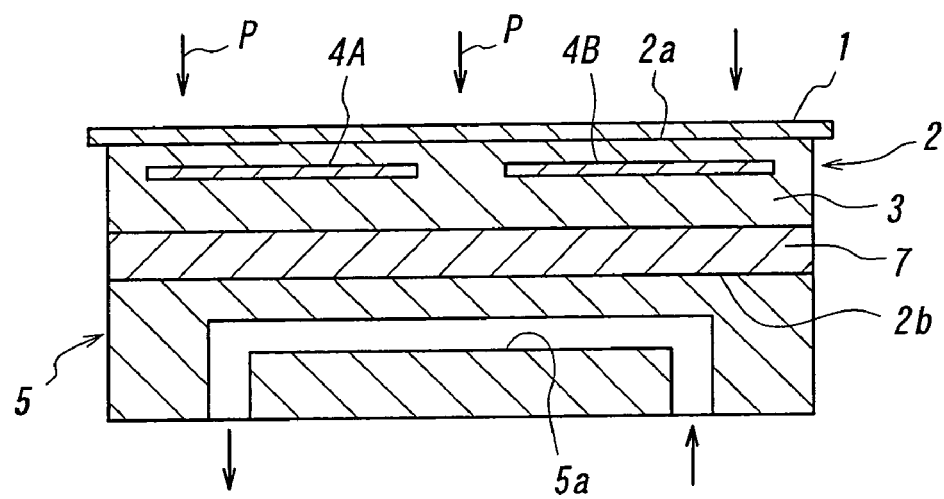
FIG. 1 is a schematic view illustrating an embodiment of the electrostatically attracting structure according to the present invention.
Figure 3:
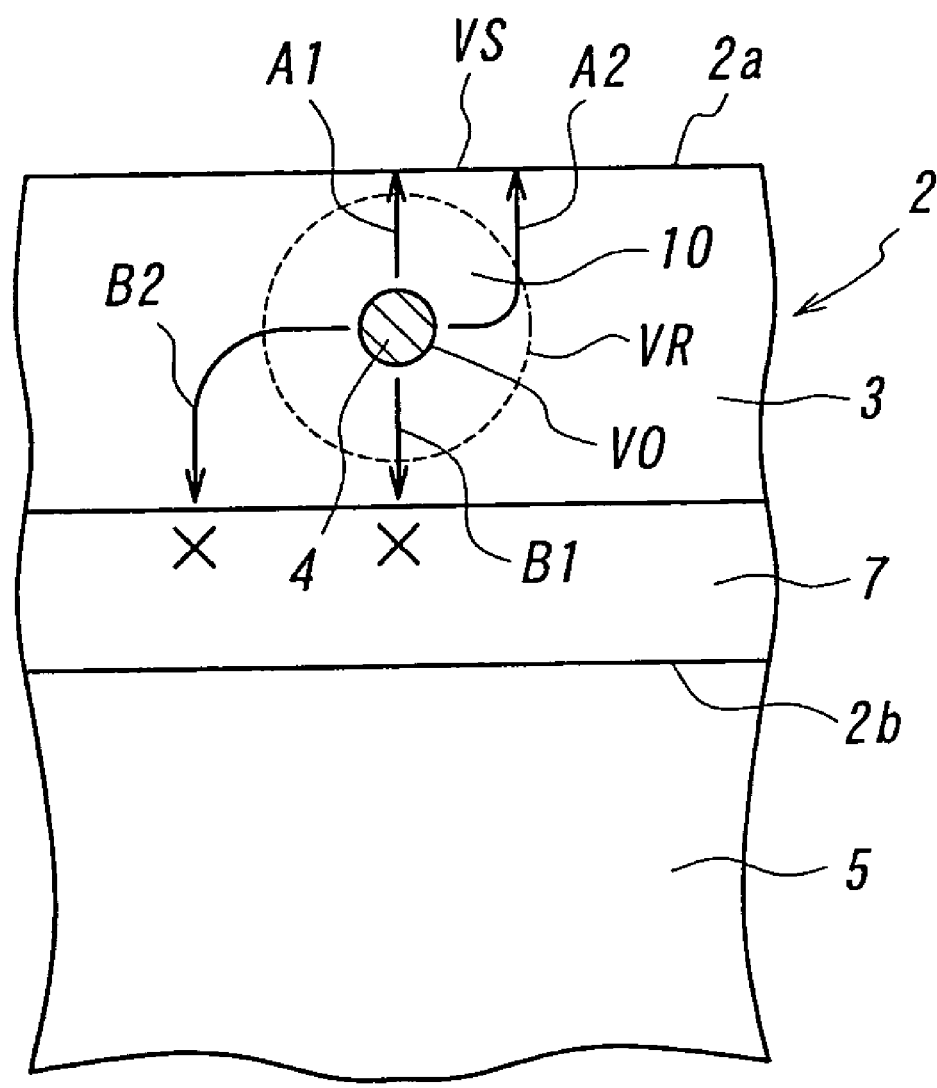
FIG. 3 is an enlarged schematic view illustrating the electrostatically attracting structure in FIG. 1.

Based on the above hypothesis, the present inventors provided an insulating layer 7 at a side of the rear face 2b of the electrostatic chuck 2 as shown in FIGS. 1 and 3. As a result, the reduction in the attraction voltage due to the joint of the electrostatic chuck to the cooling member as mentioned above was not observed. This is because the leakage currents B1, B2 are largely reduced by the insulating layer 7.

In FIG. 1, reference number 1 is a wafer, reference numbers 4A and 4B are electrodes, reference number Sa is a passage for a cooling medium, and reference letter P indicates heat entering the wafer.

The insulating layer 7 is made of an insulating material having a volume resistivity higher than that of the dielectric layer. It is preferable that the volume resistivity of the insulating material is at least 10 times higher than that of the dielectric layer at an operating temperature of the electrostatic chuck. The volume resistivity of the dielectric body is preferably $10^8$ to $10^{12}$ $\Omega$-cm in the operating temperature range. The volume resistivity of the insulating layer in the operating temperature range of the electrostatic chuck is preferably $10^{12}$ to $10^{15}$ $\Omega$-cm.

In the present invention, the electrostatic chucking electrode preferably consists of at least two electrodes having mutually different load potentials.

Although the material of the dielectric body is not particularly limited, aluminum nitride, silicon nitride, alumina, and silicon carbide are preferred. As the insulating material, aluminum nitride, silicon nitride, alumina, boron nitride, and magnesia are preferred.

Particularly preferably, the dielectric body and the insulating material are made of the same kind of ceramic materials. The "same kind of ceramic materials" means that a base material is the same, and additives differ. Particularly preferably, the dielectric body and the insulating material are based on aluminum nitride, silicon nitride or aluminum, and more preferably aluminum nitride.

The configuration, the material or the microstructure of the highly resistive area 10 of the electrostatic chuck are not clear yet. However, it is considered that the highly resistive area is likely to be formed during the firing of the ceramics. Further, it is more likely that the highly resistive area is formed particularly when the dielectric body is made of aluminum nitride. Further, the highly resistive area is particularly likely to be formed when the electrode is made of molybdenum metal or a molybdenum alloy. Aluminum nitride-based ceramics are n-type semiconductors in which electrons act as carriers. Therefore, it is considered that molybdenum metal is diffused in the ceramic material, functions as a counter-doped material, and reduces the number of the electrons as the carrier.

Although the phenomenon that molybdenum metal is diffused into the aluminum nitride-based ceramic material is not clearly understood, there is the possibility that molybdenum oxide is produced by a reaction between oxygen at surfaces of aluminum nitride particles and molybdenum, and evaporates during the firing step to be dispersed into the aluminum nitride particles.

Although the material of the electrostatic chucking electrode is not limited, metallic molybdenum or a molybdenum alloy is preferred. As the molybdenum alloy, alloys between molybdenum and tungsten, aluminum or platinum are preferred. In the case of molybdenum alloys, no upper limitation is imposed upon the amount of molybdenum, and it may be increased up to 100 wt %. The lower limit for the amount of molybdenum is preferably 50 wt %.

Besides the molybdenum metal and its alloys, pure metals such as tungsten, aluminum and platinum or their alloys are also preferred.

The joining method between the back face of the electrostatic chuck and the conductive member is not limited. Joining methods, such as brazing joining, glass joining, resin joining, a solid-phase diffusion method or the like may be employed.

Although the configuration of the electrode is not limited, the above-mentioned problems are likely to occur in the cases of a network shape or a punched metal shape, but the present invention is effective even for these cases. This is considered to be attributable to an effect owing to the electrode.

The method for producing the electrostatic chuck according to the present invention is not limited, any of the following methods can be adopted.

(1) A powdery ceramic material for a dielectric body is press molded, an electrode is placed on the molded body, and the powdery ceramic material for the dielectric body is further charged onto the resultant, followed by press molding. Then, a powdery ceramic material for an insulating layer is charged on the thus molded body, and the resultant is further press molded, thereby obtaining a molded body. A fired body is obtained by integrally firing the molded body, and the fired body is worked to obtain an electrostatic chuck.

(2) A powdery ceramic material for a dielectric body is press molded, an electrode is placed on the molded body, and the powdery ceramic material for the dielectric body is further charged onto the resultant, followed by press molding. A ceramic bulk body for an insulating layer is placed on the molded powdery body, a fired body is obtained by integrally firing the molded powdery body and the bulk body, and the fired body is worked.

(3) A powdery ceramic material for a dielectric body is press molded, an electrode is placed on the molded body, the powdery ceramic material for the dielectric body is further charged onto the resultant, followed by press molding and integral firing. Thereby, a fired body is obtained. A ceramic bulk body for an insulating layer is joined to the fired body, and the joined body is worked into a given configuration, thereby obtaining an electrostatic chuck. At that time, the joining method may be glass joining, resin joining, diffusion joining or the like.

EXAMPLES

Example 1

An electrostatic chuck of the double electrode type shown in FIG. 1 was produced according to the above-mentioned producing method (1). More particularly, powdery aluminum nitride for a dielectric body obtained by a reducing/nitriding method was used, an acrylic resin binder was added to this powder, and the mixture was granulated by a spray dryer, to thereby obtain the granulated powder. A preliminarily molded discoid body of 200 mm in diameter and 30 mm in thickness was produced by molding the granulated powder. At that time, electrodes were buried in the molded body, and the molding pressure was 200 kg/cm². A metal net in which molybdenum wires of 0.20 mm in diameter were knitted at a density of 50 wires per inch was used as the electrode. Onto the above molded body was placed powdery aluminum nitride for an insulating layer, which would give a different volume resistivity under the same firing conditions, followed by press molding under 200 kg/cm².

This discoid molded body was placed in a hot press mold, and sealed therein. The temperature was raised at a heating rate of 300° C./h, and the pressure was reduced at that time over a temperature range of room temperature to 1300° C. The pressing pressure was increased simultaneously with the increase in the temperature. The maximum temperature was set at 1900° C., and the molded body was held at the maximum temperature for 5 hours, thereby obtaining a fired body. Numerous projections, each having a circular shape as viewed in plane, were formed on an attracting plane of the fired body by blasting, thereby obtaining the electrostatic chuck in Example 1. The depth of the electrode from the wafer-installing face was 1 mm, the volume resistivity of the dielectric layer was adjusted to $1 \times 10^{10}$ Ω-cm at room temperature, and the volume resistivity of the insulating layer was to about $1 \times 10^{13}$ Ω-cm.

The attracting force of the electrostatic chuck was measured. Load voltages were set at +300 V and −300 V. The attracting force of this electrostatic chuck for a silicon wafer was measured as a pressure unit (Torr). The resulting attracting force was 50 to 70 Torr at room temperature.

Next, a silver paste was coated onto the back face of the electrostatic chuck, and baked at 400° C. Then, the attracting force, measured in the same manner as above, was 50 to 70 Torr at room temperature.

Example 2

An electrostatic chuck was produced in the same manner as Example 1, except that the above method (2) was employed in Example 2. Electrodes were buried in an aluminum nitride molded body dielectric layer, and a planar plate (3 mm in thickness) was also prepared from a sintered body of aluminum nitride for the insulating layer. The molded body was laminated with the planar plate. The thus obtained laminated body was placed in a hot press mold and fired in the same manner as in Example 1.

In the thus obtained electrostatic chuck, the volume resistivity of the dielectric layer was $1 \times 10^{10}$ Ω-cm, whereas that of the insulating layer was $2 \times 10^{13}$ Ω-cm. Measurement of the attracting force of this electrostatic chuck for the silicon wafer was 50 to 70 Torr. After a silver paste was baked onto the back face of the electrostatic chuck, the attracting force was measured to be 50 to 70 Torr.

Example 3

An electrostatic chuck was produced in the same manner as Example 1, except that the above method (3) was employed in Example 3. Electrodes were buried in an aluminum nitride molded body used for the dielectric layer, and the molded body was fired in the same manner as in Example 1, thereby obtaining a fired body having a volume resistivity of $3 \times 10^{10}$ Ω-cm. A sintered body of aluminum nitride formed as a planar plate (5 mm in thickness, volume resistivity $1 \times 10^{14}$ Ω-cm) for the insulating layer was also prepared. The above fired body, in which the electrodes were buried, was laminated with the planar plate for the insulating layer, and both were joined by the solid phase joining method.

Measurement of the attracting force of this electrostatic chuck for the silicon wafer was 50 to 70 Torr. After a silver paste was baked onto the back face of the electrostatic chuck, the attracting force was measured to be 50 to 70 Torr.

Comparative Example

An electrostatic chuck was produced in the same manner as in Example 1, except that the substrate of the electrostatic chuck was entirely formed by the above-mentioned aluminum nitride for the dielectric layer, while an aluminum nitride insulating layer was not used.

Measurement of the attracting force of this electrostatic chuck for the silicon wafer was 50 to 70 Torr. After a silver paste was baked onto a back face of the electrostatic chuck, the attracting force was measured to be 38 Torr.

As mentioned above, according to the present invention, reduction in the attracting force, which would ordinarily occur after the electrostatic chuck is joined to the conductive member, can be prevented.

What is claimed is:

1. A Johnsen-Rahbek effect electrostatic chuck comprising:
   a substrate having a wafer-installing face and an opposed back face, an electrostatic chucking electrode buried in said substrate, and an insulating layer provided on said back face of said substrate;
   said substrate further comprising a dielectric layer including at least said wafer-installing face and surrounding said electrostatic chucking electrode;
   wherein said insulating layer comprises an insulating material having a larger volume resistivity than that of said dielectric layer;
   wherein an area of said dielectric layer that contacts said elecrostatic chucking electrode has a higher volume resistivity than the remainder of said dielectric layer; and
   wherein leakage current originating from said electrostatic chucking electrode is reduced and inhibited from flowing through said insulating layer.

2. The electrostatic chuck set forth in claim 1, wherein said electrostatic chucking electrode further comprises at least two electrodes having different load potentials.

3. The electrostatic chuck set forth in claim 1, further comprising an electrically conductive member provided on said back face of said substrate and adapted to release heat inputted from said wafer-installing face to said conductive member.

4. The electrostatic chuck set forth in claim 1, wherein said electrostatic chucking electrode comprises a net or punched metal.

5. The electrostatic chuck set forth in claim 1, wherein said electrostatic chucking electrode comprises molybdenum metal or a molybdenum alloy.

6. An electrostatically attracting structure comprising:
   a Johnsen-Rahbek effect electrostatic chuck for attracting a wafer and an electrically conductive member joined to a back face of said electrostatic chuck;
   said electrostatic chuck comprising a substrate having a wafer-installing face and an opposed back face, and an -electrostatic chucking electrode buried in said substrate;
   said substrate farther comprising a dielectric layer including at least said wafer-installing face and surrounding said -electrostatic chucking electrode, and an insulating layer provided on said back face of said substrate;

wherein said insulating layer comprises an insulating material having a larger volume resistivity than that of the said dielectric layer;

wherein an area of said dielectric layer that contacts said electrostatic chucking electrode has a higher volume resistivity than the remainder of said dielectric layer; and wherein leakage current originating from said electrostatic chucking electrode is reduced and inhibited from flowing through said insulating layer toward said electrically conductive member.

7. The electrostatically attracting structure set forth in claim 6, wherein said electrostatic chucking electrode further comprises at least two electrodes having different load potentials.

8. The electrostatically attracting structure set forth in claim 6, wherein said electrostatic chucking electrode comprises a net or punched metal.

9. The electrostatically attracting structure set forth in claim 6 wherein said electrostatic chucking electrode comprises molybdenum metal or a molybdenum alloy.

10. The electrostatically attracting structure set forth in claim 6, wherein said electrically conductive member comprises a cooling member.

11. A Johnsen-Rahbek effect electrostatic chuck comprising:

a dielectric layer defining a wafer-installing face and having an opposed back face;

at least two electrostatic chucking electrodes having different load potentials buried in and surrounded by said dielectric layer; and an insulating layer co-fired with said dielectric layer and provided on said back face of said dielectric layer, said insulating layer comprising an insulating material having a larger volume resistivity than that of said dielectric layer;

wherein an area of said dielectric layer that contacts each said at least two electrostatic chucking electrodes has a higher volume resistivity than the remainder of said dielectric layer; and wherein leakage current originating from said at least two electrostatic chucking electrodes is reduced and inhibited from flowing through said insulating layer.

12. The electrostatic chuck set forth in claim 11, further comprising an electrically conductive member provided on said insulating layer and adapted to release heat inputted from said wafer-installing face to said conductive member.

13. The electrostatic chuck set forth in claim 11, wherein said at least two electrostatic chucking electrodes comprise a net or punched metal.

14. The electrostatic chuck set forth in claim 11, wherein said at least two electrostatic chucking electrodes comprise molybdenum metal or a molybdenum alloy.

15. An electrostatically attracting structure comprising:

a Johnsen-Rahbek effect electrostatic chuck for attracting a wafer and an electrically conductive member joined to a rear face of said electrostatic chuck;

said electrostatic chuck comprising a dielectric layer defining a wafer-installing face and having an opposed back face, at least two electrostatic chucking electrodes having different load potentials buried in and surrounded by said dielectric layer, and an insulating layer co-fired wit said dielectric layer and provided on said back face of said dielectric layer, said insulating layer defining said rear face of said electrostatic chuck, and said insulating layer comprising an insulating material having a larger volume resistivity than that of said dielectric layer;

wherein an area of said dielectric layer that contacts each said at least two electrostatic chucking electrodes has a higher volume resistivity than the remainder of said dielectric layer; and wherein leakage current originating from said at least two electrostatic chucking electrodes is reduced and inhibited from flowing through said insulating layer toward said electrically conductive member.

16. The electrostatically attracting structure set forth in claim 15, wherein said at least two electrostatic chucking electrodes comprise a net or punched metal.

17. The electrostatically attracting structure set forth in claim 15, wherein said at least two electrostatic chucking electrodes comprise molybdenum metal or a molybdenum alloy.

18. The electrostatically attracting structure set forth in claim 15, wherein said electrically conductive member comprises a cooling member.

* * * * *

UNITED STATES PATENT AND TRADEMARK OFFICE
CERTIFICATE OF CORRECTION

PATENT NO. : 7,042,697 B2
APPLICATION NO. : 10/675524
DATED : May 9, 2006
INVENTOR(S) : Hideyoshi Tsuruta and Naohito Yamada It is certified that error appears in the above-identified patent and that said Letters Patent is hereby corrected as shown below:

Column 6

*Line 38:* please change "elecrostatic" to --electrostatic--
*Line 64:* please change "-electrostatic" to --electrostatic--
*Line 66:* please change "farther" to --further--

Column 7

*Line 1:* please change "-electrostatic" to --electrostatic--
*Line 5:* please delete "the"
*Line 22:* please add --,-- after "claim 6"

Column 8

*Line 20:* please change "wit" to --with--

Signed and Sealed this

Fifteenth Day of August, 2006

JON W. DUDAS
*Director of the United States Patent and Trademark Office*